(12) United States Patent
McBride et al.

(10) Patent No.: US 6,249,899 B1
(45) Date of Patent: Jun. 19, 2001

(54) SYSTEM AND METHOD FOR DETECTING PASS FETS

(75) Inventors: John G McBride, Ft. Collins; Jan Kok, Fort Collins, both of CO (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/273,631

(22) Filed: Mar. 23, 1999

(51) Int. Cl.[7] .................................................. G06F 17/50
(52) U.S. Cl. ............................................................. 716/4
(58) Field of Search ..................................................... 716/4

(56) References Cited

U.S. PATENT DOCUMENTS 5,796,990 * 8/1998 Erle et al. ................................ 716/4

* cited by examiner

Primary Examiner—Trong Phan

(57) ABSTRACT

To achieve the advantages and novel features, the present invention is generally directed to a system and method for identifying pass FETs from a netlist. In accordance with one aspect of the invention, a method identifies pass FETs from a netlist by identifying complementary pass FET circuit configurations at each node, identifying RAM pass FET circuit configurations at the node, and identifying single pass FET circuit configurations at the node. In accordance with another aspect of the invention, a system is provided for identifying pass FETs connected to a selected node of an integrated circuit. The system operates by evaluating a netlist at the node, and further includes a code segment for identifying complementary pass FET circuit configurations at the node, a code segment for identifying RAM pass FET circuit configurations at the node, and a code segment for identifying single pass FET circuit configurations at the node.

20 Claims, 9 Drawing Sheets

ELEMENT { ~~~~

~~~~

Complementary Pass FET
RAM Pass FET
Single Pass FET

~~~~~

~~~~~

Direction: Unset, Bidirectional, Source-to-Drain,
　　　　　　Drain-to-Source

~~~~~ }

SYSTEM AND METHOD FOR DETECTING PASS FETS

BACKGROUND OF THE INVENTION

1. Field of the Invention

The present invention generally relates to computer-aided circuit design systems, and more particularly to a system and method for evaluating a netlist of an integrated circuit to identify pass FETs.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, todays sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using Boolean equations. The structural description is represented as a netlist of primitive cells. Examples of primitive cells are full-adders. NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing, requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. For example, there is often a need to identify certain logic gates or particular combinations of logic gates. More specifically, there is sometimes a need to identify combinations of gates that are configured in such a manner that may lead to operational uncertainty or performance problems. By way of particular example, it is sometimes desirable to identify gates configured to operate as pass FETs. There are various reasons why such a gate identification may be desirable, which will be appreciated by those skilled in the art.

Accordingly, there is a heretofore unaddressed need to provide a design tool that evaluates a netlist or other electronic file representative of an electronic circuit to identify circuit configurations that form or operate as pass FETs.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for identifying pass FETs from a netlist. In accordance with one aspect of the invention, a method identifies pass FETs from a netlist by identifying complementary pass FET circuit configurations at the node, identifing RAM pass FET circuit configurations at the node, and identifying single pass FET circuit configurations at the node.

In accordance with the preferred embodiment, the method identifies complementary pass FET circuit configurations by identifying all FETs that are channel connected to the node, compiling a list of all elements that are channel connected to the node in parallel fashion, evaluating each NFET that is channel connected to the node for PFETs that are connected in channel-parallel fashion to the NFET, and determining whether the gate node of the NFET is a static inverse of the gate of a PFET that is connected in channel-parallel fashion to the NFET. Alternatively, the method may operate to evaluate each PFET that is channel connected to the node for NFETs that are connected in channel-parallel fashion to the PFET, and determine whether a gate node of the PFET is a static inverse of the gate of a NFET that is connected in channel-parallel fashion to the PFET. As will be appreciated by those skilled in the art, FETs are considered to be "channel-parallel" if the channel nodes (source and drain) of one FET are directly connected to the channel nodes of another FET. However, if both the source and drain nodes of a given FET are connected to the same node, that FET is not considered to be channel-parallel with any other FET.

The preferred embodiment operates to identify RAM pass FET configurations by determining whether the node is a storage node, identifying at least one NFET that is channel connected to the node, evaluating a channel node of the at least one identified NFET that is opposite the storage node to determine whether the opposite node is an output node, evaluating whether the opposite node is an output node includes the step of evaluating a direction flag of the at least one identified NFET, identifying and evaluating each node that is a static inverse to the storage node, identifying at least one NFET that is channel connected to the static inverse node, and evaluating a channel node of the at least one identified NFET that is opposite the storage node to determine whether the opposite node is an output node.

In accordance with another aspect of the invention, a system is provided for identifying pass FETs connected to a selected node of an integrated circuit. The system operates by evaluating a netlist at the node, and further includes means for identifying complementary pass FET circuit configurations at the node, means for identifying RAM pass FET circuit configurations at the node, and means for identifying single pass FET circuit configurations at the node.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
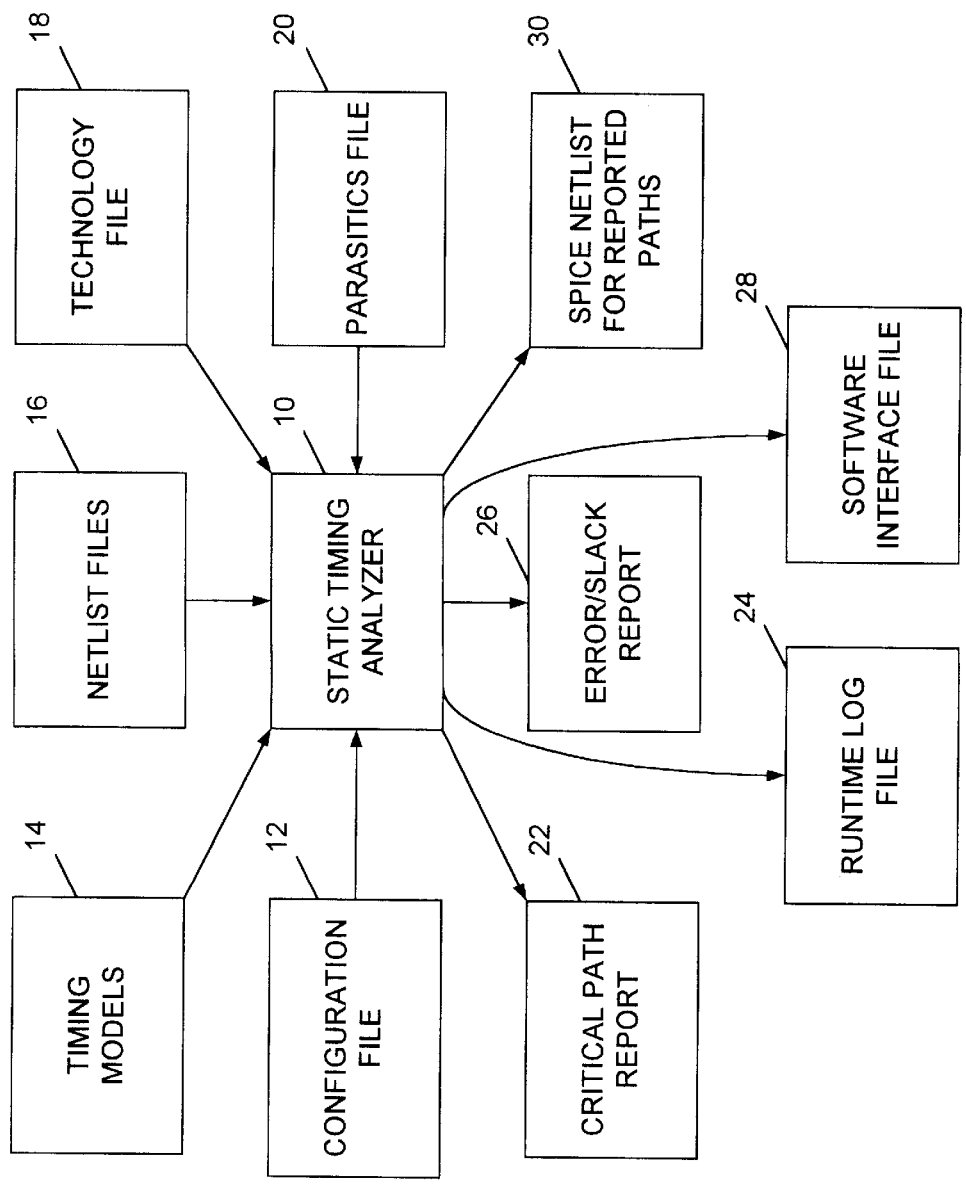
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as Static Timing Analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitics file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration files 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations. The static timing analyzer 10 may make its internal database or netlist available to the electrical rules checker, which in turn may generate a binary file output 106.

The electrical rules checker 100 program of the present invention is preferably configured to operate on an output of the static timing analyzer 10. In this regard, the static timing analyzer may be configured to generate an output netlist database, which the electrical rules checker of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. A portion 102 of the electrical rules checker program 100 of the preferred embodiment of the present invention operates to identify pass FETs.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker of the present invention provides an excellent mechanism for double-checking designs and design layouts.

Figure 2:
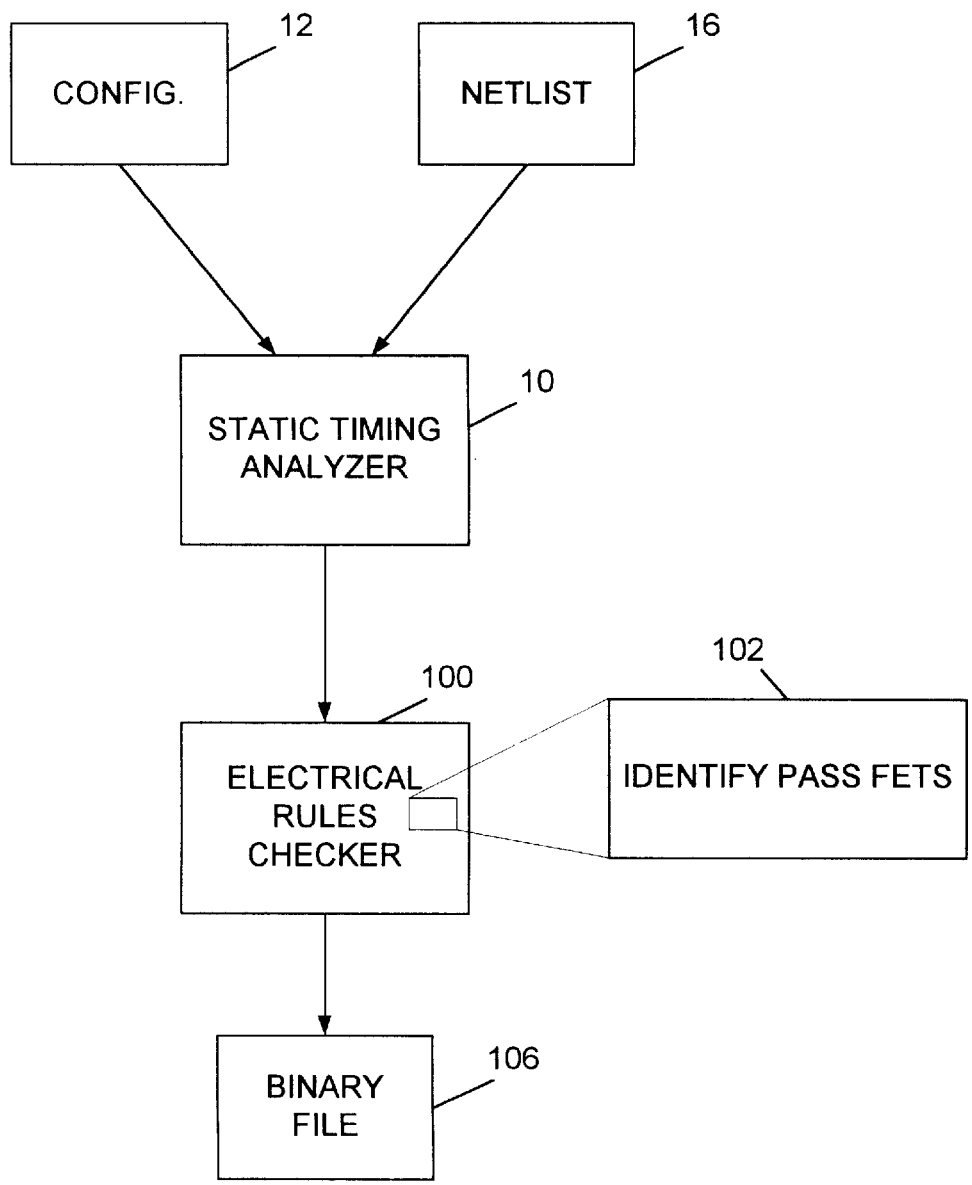
FIG. 2 is a block diagram illustrating the orientation of the electrical rules checking method of the present invention, in relation to an existing static timing analyzer.

In keeping with the description of FIG. 2, the electrical rules checker 100 of the present invention may generate an output binary file 106, which may ultimately be used in subsequent executions of the electrical rules checker program 100.

Having described certain environmental and other background system information, the discussion will now be directed toward the inventive aspects of the present invention. In this regard, one aspect of the present invention is to provide a method for detecting pass FET devices from a netlist. In accordance with the invention, three different types of pass FETs may be identified. These include complementary pass FETs, RAM pass FETs, and single pass FETs. In accordance with the preferred embodiment of the present invention, a data structure is associated with each element of a netlist (See FIG. 3). Among a large number of parameters or characteristics, the element data structure of the preferred embodiment includes three separate flags that may be used in identifying the given element as a pass FET device. Specifically, a "Complementary Pass FET" flag may be set if the element is determined to be a complementary pass FET, a "RAM Pass FET" flag may be set if the element is determined to be a RAM pass FET, and a "Single Pass FET" flag may be set if the element is determined to be a single pass FET.

Figures 3, 4:
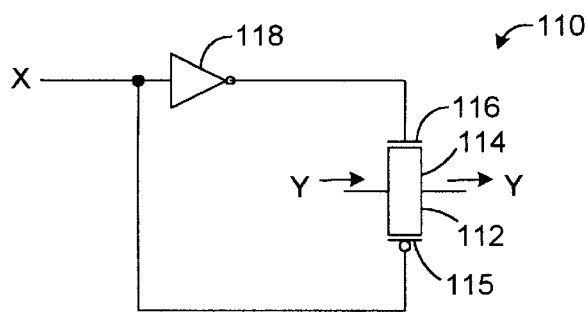
FIG. 3 is a diagram illustrating a portion of a data structure of a circuit element, depicting certain flags, in accordance with the invention.
FIG. 4 is a schematic diagram illustrating a complementary pass FET configuration.

Before describing the method of the present invention, reference will first be made to FIGS. 4, 5, 6A and 6B, which are schematic diagrams that illustrate the electrical connectivity of a complementary pass FET, a RAM pass FET, and single pass FETs, respectively. Referring first to FIG. 4, a complementary pass FET 110 circuit configuration is shown. In short, a complementary pass FET is defined by a channel-parallel connection between a PFET 112 and an NFET 114, where the gate node 115 of the PFET is driven by the inverse signal of the gate node 116 of the NFET. In this regard, the complementary pass FET 110 illustrated in FIG. 4 shows a PFET device 112 having its channel nodes (e.g., source node and drain node, in either order) directly connected to the channel nodes of the NFET device 114. An input signal X directly drives the gate node 115 of the PFET. That same signal X drives the input of an inverter 118, whose output directly drives the gate node 116 of the NFET 114. It will be appreciated by those skilled in the art that this particular circuit configuration comprises a complementary pass FET, wherein a signal Y applied to the source nodes of the PFET 112 and NFET 114 is passed through to the drain nodes of the same devices.

Figure 5:
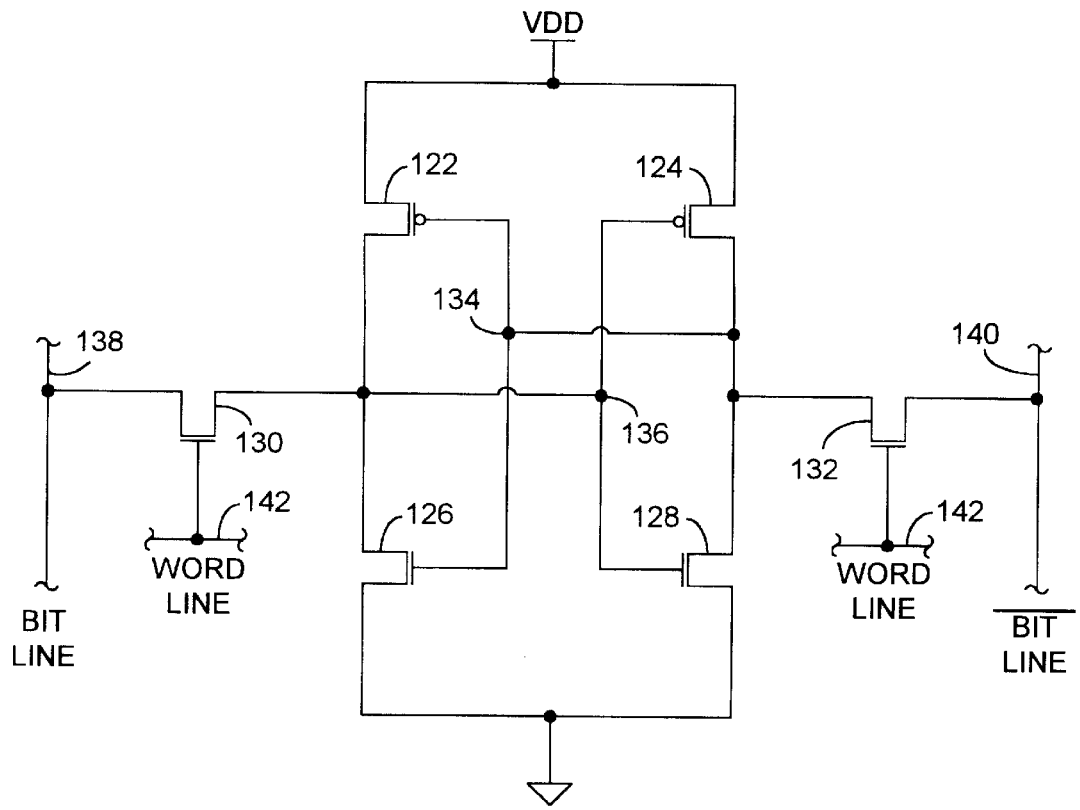
FIG. 5 is a schematic diagram illustrating a RAM pass FET configuration.

Referring to FIG. 5, a schematic diagram of a RAM pass FET 132 (i.e., a pass FET connected to a RAM cell) is shown, As is known by persons skilled in the art, a RAM cell is comprised of cross-coupled inverters. As is further known, an inverter is constructed from a pair of FETs, specifically comprising a PFET series connected (channel nodes) with an NFET, wherein the series connected devices are connected between VDD and ground. The input to such an inverter is applied to the gate node of both FET devices, and the output is taken from the common channel node between the two FET devices.

More specifically, and as illustrated in FIG. 5, a RAM cell comprising PFETs 122 and 124, and NFETs 126, 128, 130, and 132 is shown. The illustrated interconnections between PFET 122 and NFET 126, between VDD and ground comprises a first inverter having an input on node 134 and an output on node 136. Likewise, the illustrated interconnections between PFET 124 and NFET 128, between VDD and ground comprises a second inverter having an input at node 136 and an output at node 134. The two inverters are said to be cross-coupled since the input of each is connected to the output of the other. Completing the RAM cell are NTETs 130 and 132. In a manner that is well known, NFET 130 is channel connected between node 136 and a bit line 138 for the RAM device. Similarly, NFET 132 is channel connected between node 134 and the inverse of bit line 138, which inverse bit line is designated by reference numeral 140. Both NFETs 130 and 132 are gate connected to a common word line 142 of the RAM device. Operation of the above-described RAM cell need not be described herein, as it will be appreciated by those of ordinary skill in the art. Indeed, the drawing of FIG. 5 is presented herein simply to assist in illustrating the method of the preferred embodiment of the present invention.

Figure 6A:
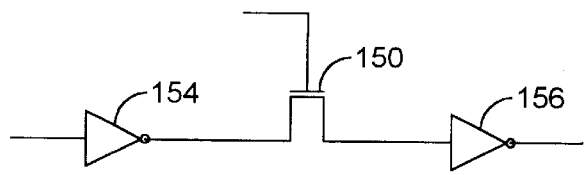
FIGS. 6A and 6B are schematic diagrams illustrating single pass FET configurations for and NFET and PFET, respectively.
Figure 6B:
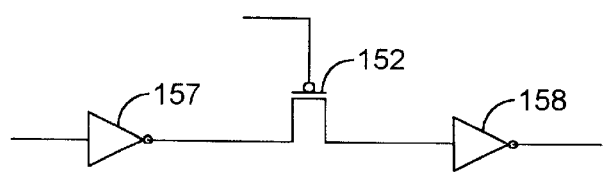

Referring briefly to FIGS. 6A and 6B, single pass FET structures are shown. In this regard, FIG. 6A illustrates an NFET 150 configured as a pass FET, while FIG. 6B illustrates a PFET 152, configured as a pass FET. As previously mentioned, a pass FET is broadly defined as comprising a gate that interconnects an output of one gate to an input of another gate. Accordingly, the NFET 150 of FIG. 6A is illustrated as interconnecting the output of an inverter 154 to the input of a second inverter 156. Likewise, the PFET 152 of FIG. 6B is illustrated as interconnecting the output of an inverter 157 to the input of a second inverter 158. In accordance with one aspect of the invention, the present invention will identify either configuration shown above as identifying element as a single pass FET device.

Figure 7A:
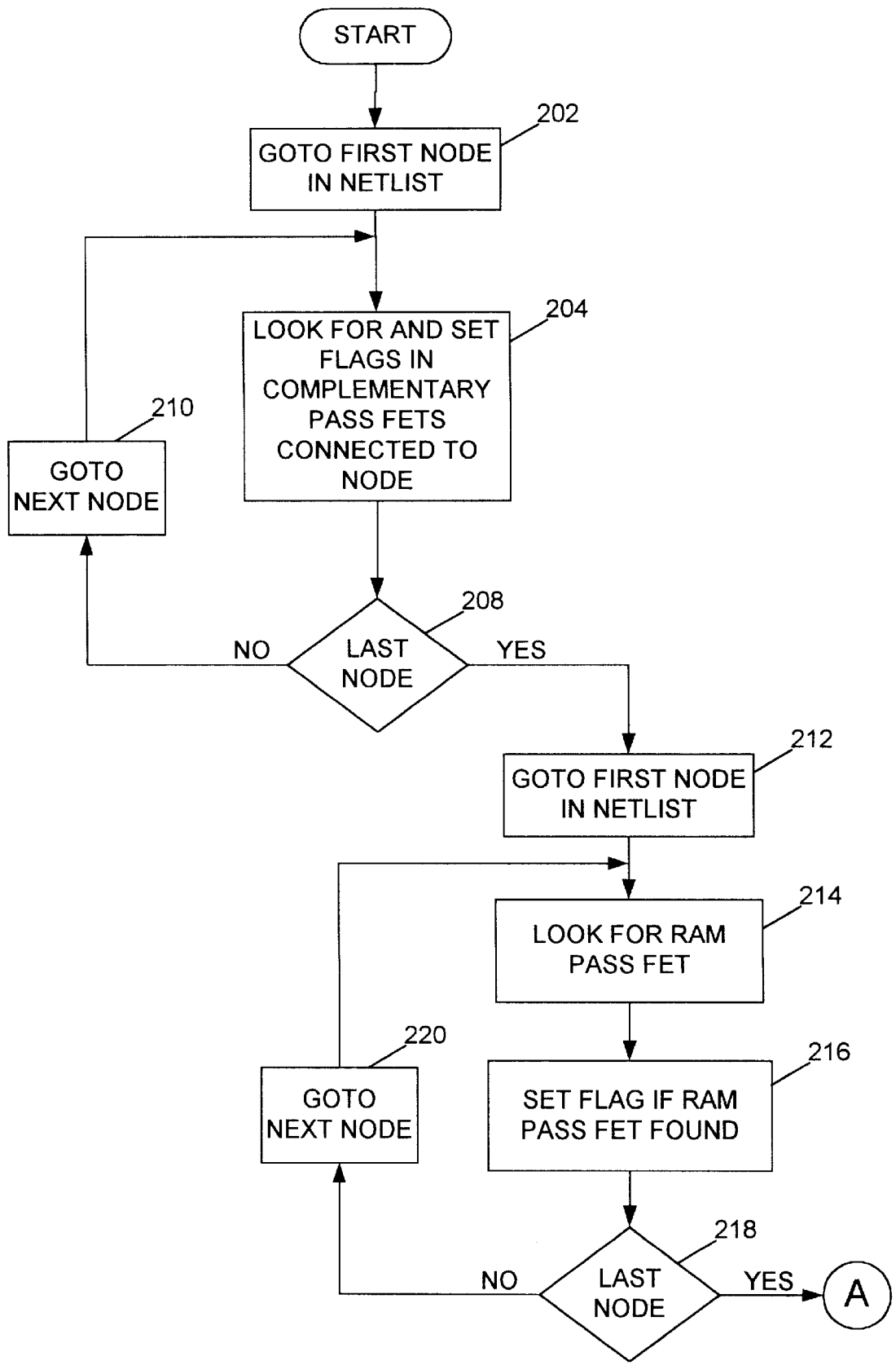
FIGS. 7A–7B collectively are a flow chart illustrating the top-level functional operation of a method in accordance with the invention.
Figure 7B:
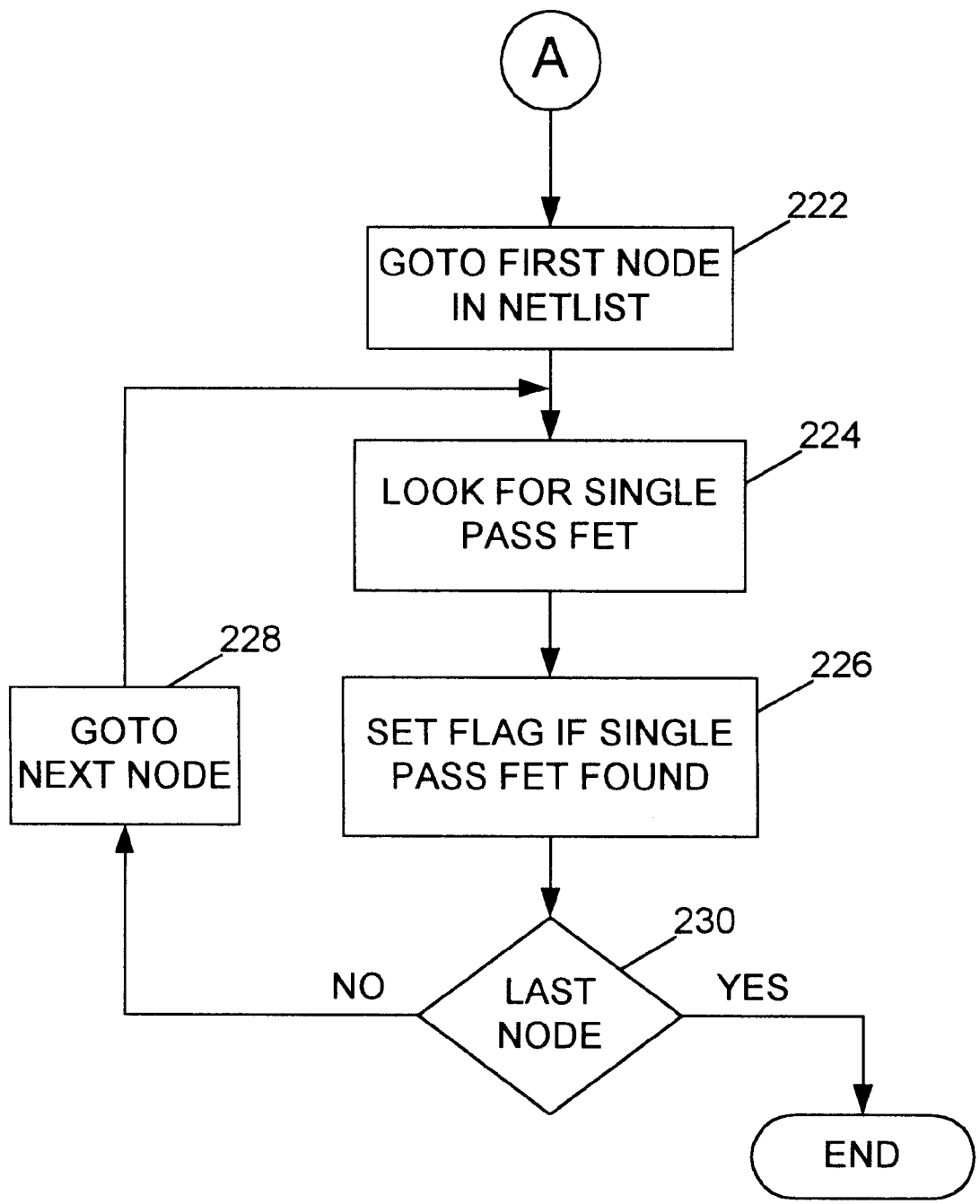

Having set forth the basic circuit configurations of the various pass FET structures identified by the method of the present invention, reference is now made to FIGS. 7A and 7B, which collectively comprise a flow chart that illustrates the top-level functional operation of a method constructed in accordance with the preferred embodiment of the present invention. In short, the method of the preferred embodiment of the present invention makes three sequential passes through each node of the netlist. In a first pass, the method identifies all complementary pass FET configurations, and for any such identified configuration, will set the appropriate flag in the data structure for each element, accordingly. On a second pass through the netlist, the method identifies all RAM pass FETs, and sets the appropriate element flags. Finally, in a third pass through the netlist, the method of the preferred embodiment identifies all single pass FET configurations, and sets the appropriate element flags. In this regard, the method begins by going to a first node in the netlist (step 202). At that node, the method then looks for all interconnected elements to identify a complementary pass FET configuration and sets the appropriate flag of the element data structure for all elements identified as comprising complementary pass FET configurations (step 204). Additional detail regarding this step of the method will be further described in connection with FIGS. 8A and 8B. The method then evaluates (step 208) whether the previously evaluated netlist node was the last node of the netlist. If not, the method proceeds to the next node in the netlist (step 210) and returns to step 204. This loop is repeated until the entire netlist file has been traversed.

If step 208 resolves to true, then the netlist has been entirely traversed once, and the method returns to the first node in the netlist (step 212). It then evaluates this node for all channel connected elements to determine whether any such elements comprise a RAM-type pass FET (step 214). Further detail regarding this step will be illustrated in connection with the flow chart of FIG. 9. For every pass FET identified in step 214 as a RAM pass FET, the method then sets the appropriate flag of the element data structures accordingly (step 216). The method then determines whether the previously evaluated node was the last node of the netlist (step 218). If not, the method proceeds to the next node (step 220) and returns to step 214. This processing loop is repeated until all nodes of the netlist have been evaluated.

Accordingly, if step 218 resolves to yes, the method then returns to the first node of the netlist (step 222). It then evaluates the current node for FET devices that constitute a single pass FET device (step 224). In this regarding, the method determines whether the node under present evaluation is an output node. If so, then the method looks to identify all FET devices that are channel connected to this node. For all such FET devices identified, the method looks to the channel node opposite the current node to determine whether that channel node is an input node (e.g., a node connected to the input of another gate). If so, all such identified FETs may be considered pass FETs.

As will be appreciated by those skilled in the art, a node may be determined to be an output node by evaluating the direction flags of the various elements that are channel-connected to that node, or by evaluating certain flags associated with the node. Such flags may be set by PathMill, by the system of the preferred embodiment, or in some other fashion, consistent with the concepts and teachings of the present invention. Since the manner in which a node may be determined to be an output node may vary, a detailed discussion of this aspect of the system and method of the preferred embodiment need not be provided herein. For each FET so identified, the present invention will reset the "current node" to the node opposite the original current node, and repeat the above-described evaluation. In this way, the invention will traverse a string of series-connected pass FETs, setting the single pass FET flag within the element data structure of each pass FET within the string. The invention will continue to traverse the string, until reaching a static gate input or a supply. Thus, the string of pass FETs will be defined as those pass FETs extending between a static gate input and a static gate output, or between a static gate output and a supply.

In addition, the method may further confirm that any such identified FET device has not already been identified as comprising a portion of a complementary pass FET or a RAM pass FET (by evaluating the appropriate flags of that element's data structure). If the current element has not been previously designated as either a complementary pass FET or a RAM pass FET, then it is determined to be a single pass FET, and the single pass FET flag of that element's data structure may be set (step 226). The method then evaluates whether the previously evaluated node is the last node of the netlist (step 230). If not, the method proceeds to the next node (step 228) and returns to step 224. This processing loop is repeated until all nodes of the netlist have been evaluated. Thus, if step 230 resolves to yes, the method of the present invention is complete. It will be appreciated that at this point, all pass FET elements within the netlist will have been identified and designated as either complementary pass FETs, RAM pass FETs, or single pass FETs.

Figure 8:
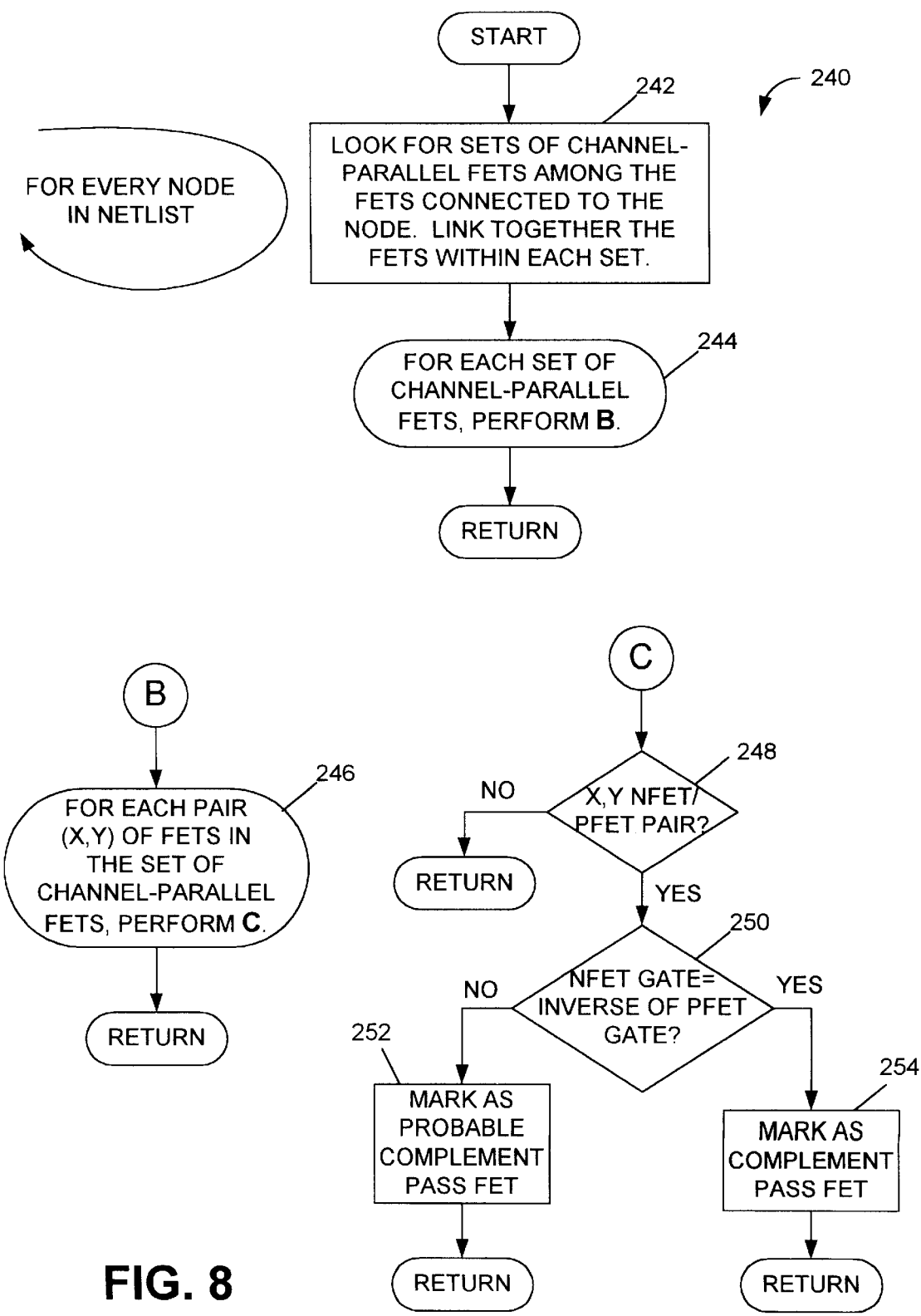
FIG. 8 is a flow chart illustrating the top-level functional operation of the preferred method for identifying complementary pass FET circuit configurations.

Having described the principal steps of the method of the present invention, reference is now made to FIG. 8, which is a flow chart 240 that illustrates the principal steps involved in identifying complementary pass FETs, as broadly denoted in step 204 of FIG. 7A. For illustrative purposes, the flowchart 240 has been split into three distinct segments. A first segment is executed for every node in the netlist file. For each such node, the method looks for sets of FETs, among the FETs that are connected to the node, that are interconnected in channel parallel fashion. Each such FET set is then linked together (step 242). Thereafter, for each such linked set, a second segment B is executed (step 244).

In this segment B, each pair (x,y) of FETs within the set of channel-parallel FETs is identified, and a third segment C is executed (step 246). In segment C, each FET pair (x,y) is evaluated to determine whether they are configured as a complementary pass FET pair. In this regard, the method determines whether one of the FETs in the FET pair is an NFET and the other FET in the FET pair is a PFET (step 248). If not, then the FET pair is not a complementary pass FET configuration. If so, then the configuration is likely a complementary pass FET configuration. At this point, the method proceeds to determine whether the gate of the NFET is the inverse of the gate of the PFET (step 250). In this respect, and as described in connection with FIG. 4, in order to form a complementary pass FET configuration, the gate node of the NFET device of the complementary pass FET must be the static inverse of the gate node of the PFET device. In accordance with the preferred embodiment of the present invention, this determination is made by evaluating certain flags associated with the netlist that are set at an earlier time. Alternatively, and consistent with the present invention, this determination is one which could be made "on the fly." Indeed, the making of this determination could be implemented in a variety of ways and therefore need not be further discussed herein.

Accordingly, if step 250 resolves to YES, then the method may mark the current PFET/NFET pair (by setting the appropriate flag of each element data structure) as comprising a complementary pass FET (step 254). If, however, step 250 resolves to NO, then the method of the preferred embodiment marks the current PFET/NFET pair as comprising a "probable" complementary pass FET configuration (step 252) and continues as previously described.

Figure 9:
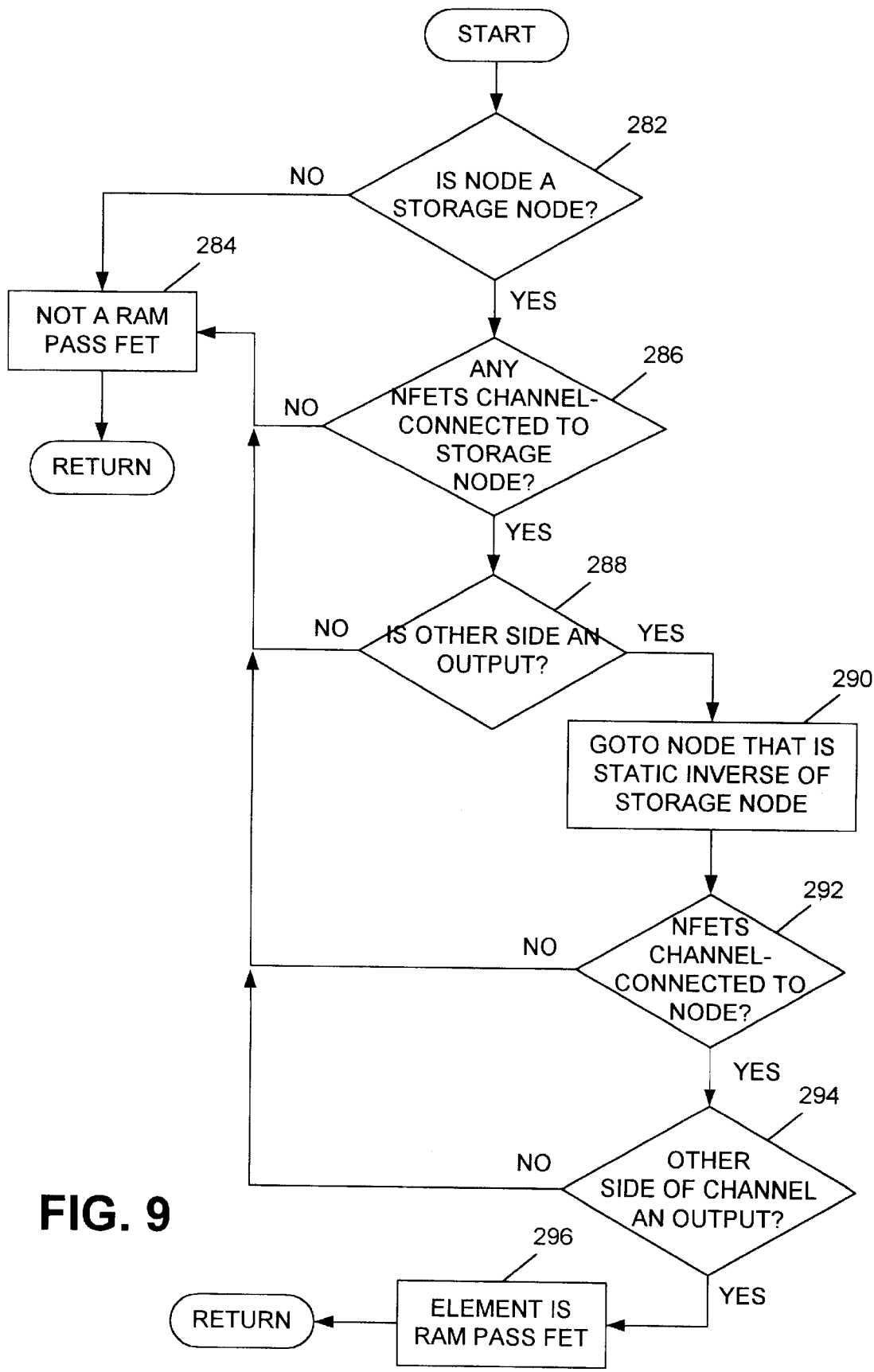
FIG. 9 is a flow chart depicting the top-level functional operation of the preferred method for identifying RAM pass FETs, in accordance with the invention.

Reference is now made to FIG. 9, which is a flow chart 280 illustrating the top-level functional operation of the method employed by the preferred embodiment of the present invention for detecting RAM pass FETs. Specifically, the flow chart 280 of FIG. 9 illustrates in more detail step 214 of FIG. 7A. In this regard. the method of the preferred embodiment evaluates a given node to determine whether the node is a storage node (step 282). This information may be retrieved from the PathMill output, or may be independently determined, consistent with the broader concepts of the present invention. It will be appreciated, that storage nodes are generally either nodes of a RAM cell, or latch nodes. If the inquiry of step 282 resolves to NO, then the method determines that the current node is not a node of a RAM pass FET (step 284), and the method may return to proceed with the processing at step 216 of FIG. 7A. If, however, the method determines that the current node is a storage node, then it proceeds to step 286, where it determines whether any NFET devices are channel connected to the current, storage node. If not, the method again determines that the current node is not a node of a RAM pass FET (step 284). In this regard, it should be understood by those skilled in the art that pass FETs associated with RAM cells are comprised of NFET devices. If, however, step 286 identifies NFET devices that are channel connected to the current storage node, then the method proceeds to step 288 where the method makes the determination as to whether the channel node opposite the current node is an output. More specifically, if a single NFET device is connected to the current, storage node by its source node, then step 288 evaluates the drain node of that NFET device to determine whether the drain node is an output. Consistent with the invention, the determination of step 288 may be made in various ways, including evaluating the direction flag that is associated with the current NFET device; namely whether the direction flag is set as defining the NFET as conducting from source to drain or from drain to source, whether it is bi-directional, or whether it is unset. Furthermore, it will be appreciated that the processing beginning at step 288 will be repeated for each NFET device identified at step 286 as being channel connected to the storage node.

If the opposite side of the channel connected NFET device is not an output, then the current NFET device is not a RAM pass FET, and the method may return to step 284. If, however, the opposite channel node of the current NFET device is determined to be an output, then the method evaluates the netlist node that is the static inverse of the current, storage node (step 290). To better illustrate this step, reference is again made briefly to FIG. 5. Assuming the current storage node is node 134, and the current NFET device identified as being channel connected to the storage node is NFET 132, and further that the opposite node 134 is determined to be an output (e.g., the node connected to bit line 140), then the method at step 290 will proceed to evaluate the node of the inverse of bit line 140; namely bit line 138. As previously described, the bit line 138 and bit line 140 will be the inverse of one another for a RAM cell. In this regard, an inverter element (not shown) will interconnect these two lines. The method of the preferred embodiment of the present invention may identify such inverters in a preprocessing step, so that at step 290, for a given node, the method may simply evaluate the node opposite the inverter. Alternatively, for a given node, step 290 may be implemented to identify any inverter devices that are connected to the current node, and then proceed to the opposite side of any such inverters. Once the method has proceeded to the static inverse node (step 290) it proceeds to evaluate that node to determine whether there are any NFETs that are channel connected to that node (step 292). If not, then the NFET device currently under evaluation is deemed not to be a RAM pass FET and the method may proceed to step 284. If, however, step 292 in fact identifies NFET devices that are channel connected to the node, then the method evaluates the channel node opposite the storage node to determine whether that opposite node is an output (step 294). It will be appreciated that step 294 may be implemented in the same manner as step 288. If step 294 determines that the other side of the channel connected NFET is not an output, then the method may proceed to step 284. If, however, the method determines the other side to, in fact, be an output, then the NFET device under evaluation is deemed to be a RAM pass FET (step 296) and the method may return to continue with the processing at step 216 of FIG. 7A.

To better illustrate the operation of the flow chart depicted in FIG. 9, again consider the schematic diagram of the CMOS RAM cell illustrated in FIG. 5. Assuming that the current node is node 136, then step 286 will identify FETs 126 and 130 as being NFET devices that are channel connected to the storage node. Proceeding to step 288, NFET 126 will fail the test, as the opposite side of NFET 126 is connected to ground and is therefore not an output. However, NFET 130 will pass the test of 288 as the other side (which is connected to bit line 138) will be determined to be an output. As previously mentioned, at step 290 the method will then evaluate node 134, which is the static inverse of node 136. Step 292 will identify NFET 132 as being channel connected to node 134. Finally, step 294 will identify the opposite node (i.e., node 138) as being an output node. Thus, the method will identify NFET 130 as being a RAM pass FET. It will be appreciated that the same determination will be made of NFET 132, when evaluating node 134.

To more particularly describe the manner of identifying single pass FET devices, the method of the present invention identifies series-connected pass FETs. In this regard, the method proceeds through the netlist, evaluating each node. It first looks for a node that is, for example, a gate output. If the currently-evaluate node is not such an output, then the method proceeds to the next node. Once the method identifies a current node to be an pass gate output, it then determines whether any FETs are channel-connected to the current node. If so, it evaluates all such FETs to determine whether the output node of the FET(s) is the same as the current node. If so, then the method sets the "current node" to the input node of any such FET, and performs the above-described steps recursively. When a point is reached such that a given test fails (essentially indicating that a static gate input or a supply—VDD or ground—has been reached), then the routine is completed, and all series-connected FETs identified above may be marked as pass FETs.

Figure 10:
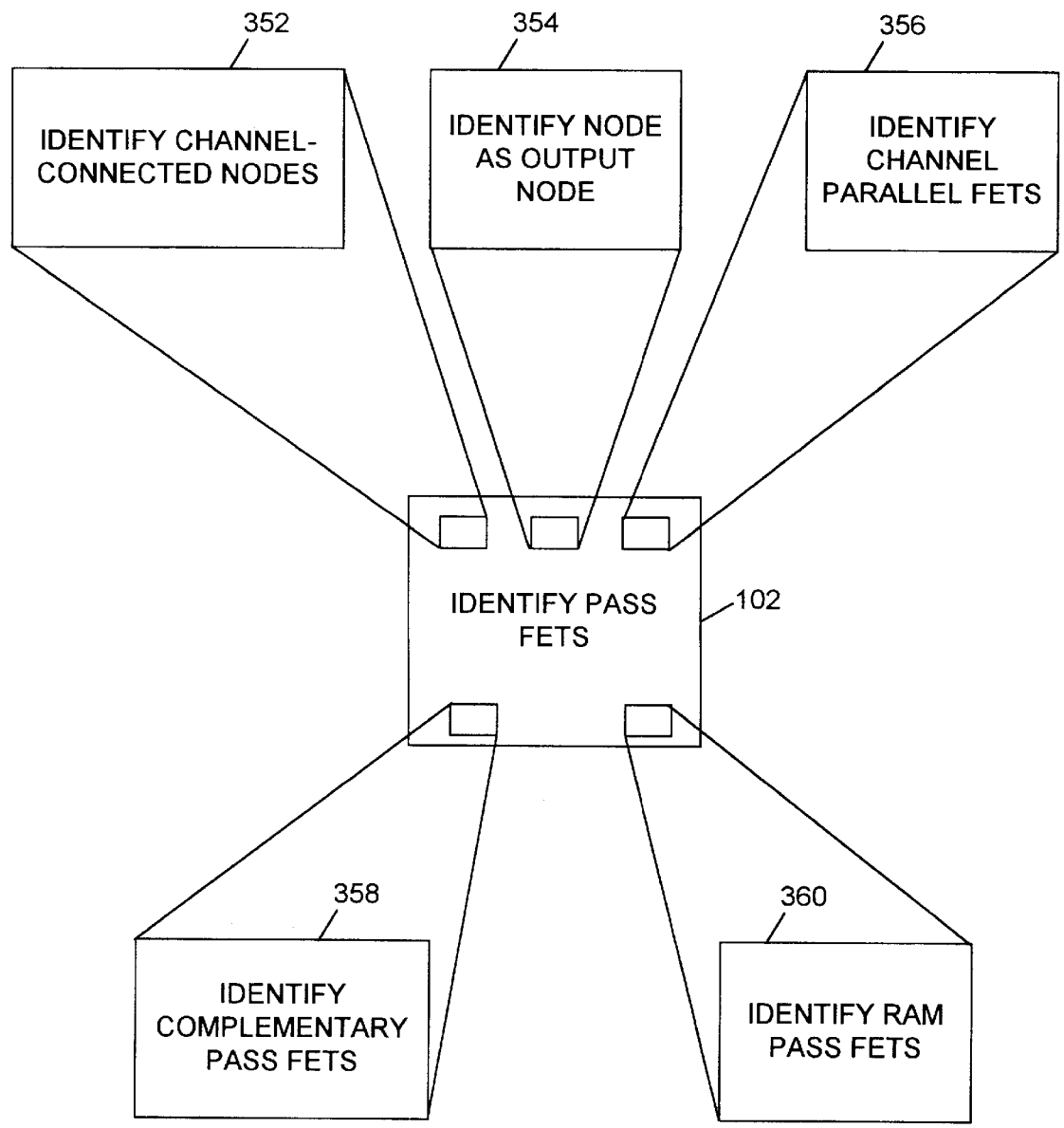
FIG. 10 is a block diagram illustrating certain fundamental code segments comprising a system constructed in accordance with the invention.

Having described the method of the present invention, it will be appreciated that the steps illustrated in the flow charts of FIGS. 7A, 7B, 8A, 8B, and 9 are provided for purposes of illustration and are not deemed to be limiting on the broader aspects of the present invention. Indeed, the broader aspects of the present invention may be implemented using a variety of different approaches that are still consistent with the scope and content of the present invention. As illustrated in FIG. 2, a portion 102 of the electrical rules checker program 100 of the present invention is configured to detect pass FET devices. In accordance with this broader aspect, a system may be provided for detecting such pass FETs. In the preferred embodiment, the system comprises software which may be provided on a computer readable storage medium in a form of code segments that are particularly configured to perform various functions. In this regard, reference is now made to FIG. 10 which illustrates certain functions which may be carried out by a system constructed in accordance with the teachings of the invention. For example, the code segment 102 may comprise a plurality of code segments including a segment for identifying channel-connected nodes 352. Another segment 354 is provided for identifying a given node as an output node. Yet another segment 356 may be configured to identify channel-parallel FET devices. Still another segment 358 nay be configured to identify complementary pass FETs. Still another segment 360 may be configured to identify RAM pass FETs. Yet additional segments (not illustrated) may be provided in connection with the system of the present invention, as will be appreciated by persons of skill in the art in light of the teachings provided herein.

It should be appreciated that the flow charts of FIGS. 7–9 show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 7–10. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for identifying pass FETs connected to a selected node of an integrated circuit by evaluating a netlist at the node comprising the steps of:

identifying complementary pass FET circuit configurations at the node;

identifying RAM pass FET circuit configurations at the node; and identifying single pass FET circuit configurations at the node.

2. The method as defined in claim 1, wherein the step of identifying complementary pass FET circuit configurations includes the step of identifying all FETs that are channel connected to the node.

3. The method as defined in claim 2, wherein the step of identifying complementary pass FET circuit configurations further includes the step of compiling sets of elements that are channel connected to the node and are channel parallel within the sets.

4. The method as defined in claim 2, wherein the step of identifying complementary pass FET circuit configurations further includes the step of evaluating each NFET that is channel connected to the node for PFETs that are connected in channel-parallel fashion to the node.

5. The method as defined in claim 4, wherein the step of identifying complementary pass FET circuit configurations further includes the step of determining whether a gate node of the NFET is a static inverse of a gate a PFET that is connected in channel-parallel fashion to the NFET.

6. The method as defined in claim 2, wherein the step of identifying complementary pass FET circuit configurations further includes the step of evaluating each PFET that is channel connected to the node for NFETs that are connected in channel-parallel fashion to the node.

7. The method as defined in claim 6, wherein the step of identifying complementary pass FET circuit configurations further includes the step determining whether a gate node of the PFET is a static inverse of a gate a NFET that is connected in channel-parallel fashion to the PFET.

8. The method as defined in claim 1, wherein the step of identifying RAM pass FET circuit configurations further includes the step of determining whether the node is a storage node.

9. The method as defined in claim 8, wherein the step of identifying RAM pass FET circuit configurations further includes the step of identifying at least one NFET that is channel connected to the node.

10. The method as defined in claim 9, wherein the step of identifying RAM pass FET circuit confirmations further includes the step of evaluating a channel node of the at least one identified NFET that is opposite the storage node to determine whether the opposite node is an output node.

11. The method as defined in claim 10, wherein the step of identifying RAM pass FET circuit configurations further includes the step of evaluating whether the opposite node is an output node includes the step of evaluating a direction flag of the at least one identified NFET.

12. The method as defined in claim 9, wherein the step of identifying RAM pass FET circuit configurations further includes the step of identifying and evaluating each node that is a static inverse to the storage node.

13. The method as defined in claim 12, wherein the step of identifying RAM pass FET circuit configurations further includes the step of identifying at least one NFET that is channel connected to the static inverse node.

14. The method as defined in claim 13, wherein the step of evaluating a channel node of the at least one identified NFET that is opposite the storage node to determine whether the opposite node is an output node.

15. The method as defined in claim 1, wherein the step of identifying single pass FET circuit configurations further includes the step of identifying at least one FET that is channel connected to the node.

16. The method as defined in claim 15, wherein the step of identifying single pass FET circuit configurations further includes the step of determining whether the node is an output node.

17. The method as defined in claim 16, wherein the step of identifying single pass FET circuit configurations further includes the step of determining whether a channel node of the at least one FET that is opposite the node is an output node.

18. The method as defined in claim 1, wherein the method repeats each of the steps for each node in the netlist.

19. A system for identifying pass FETs connected to a selected node of an integrated circuit by evaluating a netlist at the node comprising:

means for identifying complementary pass FET circuit configurations at the node;

means for identifying RAM pass FET circuit configurations at the node; and means for identifying single pass FET circuit configurations at the node.

20. A computer readable storage medium containing program code for identifying pass FETs connected to a selected node of an integrated circuit and marking each such identified FET by setting a flag in a data structure associated with the FET comprising:

a first code segment configured to identify complementary pass FET circuit configurations at a given node in a netlist and further configured to set a complementary pass FET flag in the data structure for the identified FET elements that comprise the complementary pass FET;

a second code segment configured to identify RAM pass FET circuit configurations at a given node in a netlist and further configured to set a RAM pass FET flag in the data structure for the identified FET element that comprises the RAM pass FET; and a third code segment configured to identifying single pass FET circuit configurations at a given node in a netlist and further configured to set a single pass FET flag in the data structure for the identified FET element.

* * * * *

UNITED STATES PATENT AND TRADEMARK OFFICE
CERTIFICATE OF CORRECTION

PATENT NO. : 6,249,899 B1
DATED : June 5, 2001
INVENTOR(S) : Gary Lee Vondran, Jr.

It is certified that error appears in the above-identified patent and that said Letters Patent is hereby corrected as shown below:

Column 12,
Line 23, delete "confimrations" and insert there -- configurations --

Signed and Sealed this

Third Day of December, 2002

JAMES E. ROGAN
*Director of the United States Patent and Trademark Office*